United States Patent [19]
Choi

[11] Patent Number: 5,933,159
[45] Date of Patent: Aug. 3, 1999

[54] MEMORY SYSTEM FOR PROCESSING DIGITAL VIDEO SIGNAL

[75] Inventor: Go Hee Choi, Seoul, Rep. of Korea

[73] Assignee: LG Semicon Co., Ltd., Chungcheongbuk-Do, Rep. of Korea

[21] Appl. No.: 08/833,525

[22] Filed: Apr. 7, 1997

[30] Foreign Application Priority Data

Apr. 26, 1996 [KR] Rep. of Korea ...................... 96-13072

[51] Int. Cl.⁶ ...................................................... G06F 12/06
[52] U.S. Cl. ........................ 345/517; 345/521; 348/715; 365/230.01
[58] Field of Search ..................................... 345/520, 521, 345/507, 186, 509, 515, 516, 517, 518, 202, 203; 348/413, 416, 420, 714–721; 365/230.01, 230.05, 230.03, 230.06, 230.09

[56] References Cited

U.S. PATENT DOCUMENTS

| | | |
|---|---|---|
| 5,430,684 | 7/1995 | Kim et al. ........................ 365/230.01 |
| 5,461,423 | 10/1995 | Tsukagoshi .............................. 348/416 |
| 5,550,591 | 8/1996 | Rim et al. ................................ 348/413 |
| 5,581,310 | 12/1996 | Vinekar et al. .......................... 348/718 |
| 5,619,282 | 4/1997 | Song ....................................... 348/716 |
| 5,805,227 | 9/1998 | Gi-Hwan ................................ 348/416 |

*Primary Examiner*—U. Chauhan
*Attorney, Agent, or Firm*—Morgan, Lewis & Bockius LLP

[57] ABSTRACT

A memory system for processing a digital video signal capable of accessing data in block units includes a detector circuit discriminating whether the memory system is in a reading/writing operation in one of an integer pel mode and a half pel mode. A controller circuit is coupled to the detector circuit and controls access of data in units of m×n bit block when the memory system is determined to operate in the integer mode by the detector circuit. The controller circuit controls access of data in units of (m+1)×(n+1) bit block when the memory system is determined to operate in the half pel mode of a reading operation.

27 Claims, 9 Drawing Sheets

FIG.9a
FIG.9b
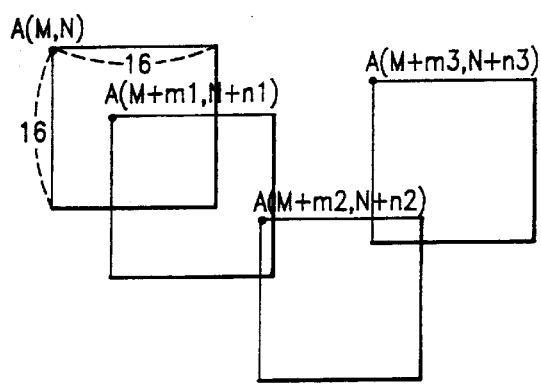
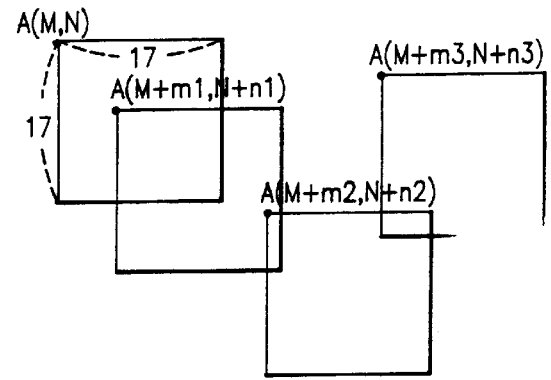
FIG.9c
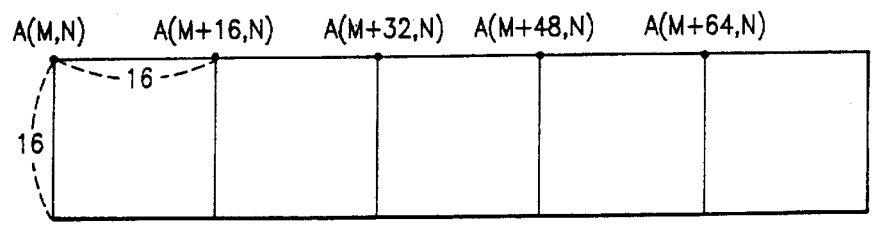

MEMORY SYSTEM FOR PROCESSING DIGITAL VIDEO SIGNAL

BACKGROUND OF THE INVENTION

1. Field of the Invention

The present invention relates in general to a memory system for processing a digital video signal, and more particularly, to a memory system for processing a digital video signal capable of accessing block data in an integer pel mode or half pel mode.

2. Discussion of the Related Act

Generally, random access memory RAM such as dynamic random access memory DRAM or static random access memory SRAM is used as the memory device of a memory system for processing digital video signals. In addition to RAM, a bit stream buffer and a memory controller are also required to convert a format of data in a format of block unit.

Here, the image processing system utilizing the video signal processing memory, determines motion vector data between the previous screen and current screen for compressing the data, and then propagates the image in response to the amount of the motion vector. The receiver processes the signal by using this to revive an original image. The image of motion vector data is processed by macro block units of 16×16 bits.

As illustrated in FIG. 1, the conventional memory system for processing digital video signal is described in U.S. Pat. No. 5,430,684 filed by the same applicant, and incorporated by reference herein.

Referring to FIG. 1, the conventional memory system for processing digital video signal includes a random block access RBA control unit 10 for controlling the random block access using signals externally applied. An address generator unit 20 generates an address using an initial address in accordance with the control of the RBA control unit 10. A memory cell array 30 stores data in accordance with the control of the RBA control unit 10 and the address generator unit 20. Transmission control unit 40 controls the data transmission of the memory cell array 30 in accordance with the RBA control unit 10 and the address generator unit 20. An input/output device inputs and outputs data in accordance with the control of the RBA control unit 10 and transmission control unit 40.

The address generator unit 20 includes a row address generator 21 and a column address generator 22. The transmission control unit 40 includes an RBA selector 41, a serial register 42, and an RBA Y-decoder 43. The input/output device 50 is includes an input/output unit 51 and an input/output controller 52.

As illustrated in FIG. 2, the RBA control unit 10 includes an X-state pointer part 11 for receiving a serial clock SC, RBA mode flag signal RBAM, RBA state pointer enable signal RSPE, and Y-state pointer signal YRn, and then outputting an X-state pointer signal Xrn. An Y-state pointer part 12 receives RBA mode flag signal RBAM, RBA state pointer enable signal RSPE, and serial clock SC, and then outputs a Y-state pointer signal Yrn. An internal row address strobe RAS generator 13 generates an internal RAS signal /RASi by using an external row address strobe signal /RAS, the X-state pointer signal XRn, the Y-state pointer signal YRn, and the RBA mode flag signal RBAM. An internal column address strobe CAS generator 14 generates an internal CAS signal /CASi by using an external CAS signal /CAS, XRn, YRn, and RBAM. A transmission controller 15 outputs a transmission signal XF, register enable signal RGE, and serial decoder enable signal SDE by using the YRn, RBAM, and SC. A reading/writing controller 16 receives the RBAM, a write enable latch signal /WEL, XRn, and YRn, and then outputs an RBA writing X-enable signal RWXE, RBA-state pointer enable signal RSPE and RBA Y-enable signal RYE. A mode selector 17 receives the XRn, YRn, an external data transmission signal /DT, RBA control signal RBA and a write enable signal /WE, and then outputs RBAM and /WEL. An internal clock generator 18 generates a system block SYCK by using RBAM, RYE, and SC.

Hereinafter, the operation of the memory system for processing digital video signals will be briefly described.

When the row address strobe signal /RAS falls, the memory system sets a proper mode in accordance with the state of the write enable signal /WE, data transmission signal /DT, and RBA control signal RBA, and forms a row address for selecting word lines of the memory cell array 30, utilizing an initial row address of the block applied to an address input pad AI.

When the column address strobe signal /CAS also falls, the memory system selects a proper cell of memory cells connected to a selected word line of the memory cell array 30, utilizing an initial column address of the block which is applied to the address input pad AI. Then the memory system forms a selection signal SELn for controlling the data transmission between the selected cells and the serial register 42 and an internal Y-address for connecting the data line of input/output part 52 and that of the serial register 42. The input/output data (16×16 bits) of any block is then continuously input/output through the input/output unit 51 in accordance with the control of the input/output controller 52. This operation is repeatedly performed to read and write block data.

For a reading operation, it is possible to give the initial address of the block of 16×16 bits as an initial address of a random position in the memory cell. However, for a writing operation, only an address whose initial address is a multiple of 16 can be input therein. That is, the system operates as a random block access for a reading operation, and a serial block access for a writing operation.

Meanwhile, in international standards for processing digital signals such as MPEG2 or HDTV, the motion vector of a macro block is displayed by a half pel unit for improving the resolution, and specifically, the macro block size of 17×17 bits is required therefor.

But, the conventional memory system for processing digital video signal sets its block size to 16×16 bits for a reading operation, and thus the system is only used for displaying the motion vector of integer pel. As a result, the conventional system can not access the block size of half pel unit, and therefore is not suitable to naturally process the resolution of current video data.

SUMMARY OF THE INVENTION

Accordingly, the present invention is directed to a memory system for processing digital video signal that substantially obviates one or more of the problems due to limitations and disadvantages of the related art.

It is an object of the invention to provide a memory system for processing a digital video signal capable of accessing block data of 16×16 bits in an integer pel mode, or in units of 17×17 bit block data in a half pel mode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the memory system for processing digital video signal includes a memory system for processing a digital video signal capable of accessing data in block units comprising a detector circuit discriminating whether the memory system is in a reading/writing operation in one of an integer pel mode and a half pel mode; and a controller circuit coupled to the detector circuit and controlling access of data in units of m×n bit block when the memory system is determined to operate in the integer mode by the detector circuit, and controlling access of data in units of (m+1)×(n+1) bit block when the memory system is determined to operate in the half pel mode of a reading operation.

In another aspect of the present invention, a memory system for processing a digital video signal capable of accessing data in block units, comprising random block access (RBA) control unit controlling a random block access using externally applied signals; address generation unit coupled to the RBA control unit and generating row and column addresses using an initial address under a control of the RBA control unit; a memory cell array coupled to the address generation unit and reading and writing data under a control of the RBA control unit and the address generation unit; transmission control unit coupled to the memory cell array and including an RBA selector, a serial register, and an RBA-Y decoder, the transmission control unit controlling data transmission of the memory cell array in a serial manner under a control of the RBA control unit and the address generation unit; input/output unit coupled to the transmission control unit and inputting and outputting data under a control of the RBA control unit and the transmission control unit; and half pel mode control unit coupled to the RBA control unit and detecting whether the system is under one of an integer pel read mode and a half pel read mode, the half pel mode control unit controlling the RBA control unit to operate in the half pel read mode when the system is under the half pel read mode.

In another aspect of the present invention, A memory system for processing a digital video signal capable of accessing data in block units, comprising random block access (RBA) control unit controlling an access of data in m×n bit block units in an integer pel reading mode and (m+1)×(n+1) bit block units in a half pel reading mode, the RBA control unit utilizing an externally applied row address strobe signal, a column address strobe signal, a write enable signal, a data transmission signal, a serial clock, an RBA controlling signal, an internally applied X-state pointer reset signal, a Y-state pointer reset signal, an X-state MSB, and a Y-state MSB; row address generating unit coupled to the RBA control unit and generating a row address using an initial row address under a control of the RBA control unit; column address generating unit coupled to the RBA control unit and generating a column address using an initial column address under a control of the RBA control unit; a memory cell array coupled to the row address generating unit and selecting word lines in accordance with the row address from the row address generating unit; an RBA selecting unit coupled to the memory cell array and controlling data transmission of the memory cell array in accordance with signals output from the column address generating unit and the RBA control unit; a serial register unit transmitting data of the memory cell array according to a signal output from the RBA control unit; an RBA-Y decoder unit controlling the serial register unit, using the column address from the column address generating unit according to the RBA control unit; input/output controlling unit controlling data input/output under a control of the RBA control unit; input/output unit coupled to the serial register unit and inputting/outputting data under a control of the input/output controlling unit; and a half pel mode controlling unit coupled to the RBA control unit and detecting whether the system is under an integer pel mode or a half pel read mode, and the half pel mode controlling unit outputting an X-state pointer controlling signal, a Y-state pointer controlling signal, an X-state MSB, and a Y-state MSB when the system is under the half pel read mode.

In another aspect of the present invention, a method of accessing data in block units, the method comprising the steps of receiving a control signal from a source containing information on a mode of operation; determining whether the mode of operation is one of an integer pel mode and a half pel mode; accessing the data in m×n bit block units when the operation is determined to be the integer pel mode; and accessing the data in (m+1)×(n+1) bit block units when the operation is determined to be the half pel mode.

In another aspect of the present invention, a memory system for processing digital video signal of the invention, which can access data by block unit, includes detecting means for discriminating if the memory system operates the integer pel reading mode or half pel reading mode; and control means for controlling data to be accessed by a block size of (m×n) bits if the system is determined to operate in the integer pel reading mode by the detecting means, and to be accessed by the block size of (m+1)×(n+1) bits if the system is determined to operate in the half pel reading mode.

In another aspect of the present invention, a memory system for processing digital video signal includes a random block access controlling means for controlling the random block access using signals applied externally; address generation means for generating row and column addresses using an initial address in accordance with the control of the RBA control means; a memory cell array for reading and writing data in accordance with the control of the RBA control means and the address generation means; transmission control means for controlling the data transmission of the memory cell array in accordance with the RBA control means and the address generation means; input/output means for inputting/outputting data in accordance with the control of the RBA control means and transmission control means; and half pel detecting means for first detecting if the means is in an integer pel reading mode or a half pel reading mode, and then controlling the RBA controlling means to operate in the half pel mode if the system is determined to be in the half pel reading mode.

In a further aspect of the invention, a memory system for processing digital video signal includes: RBA controlling means for controlling data to be accessed by the block size of m×n bits in the integer pel reading mode and by the block size of (m+1)×(n+1) bits in the half pel reading mode, utilizing a row address strobe signal /RAS applied externally, a column address strobe signal /CAS, a write enable signal /WE, a data transmission signal /DT, a serial clock/SC, an RBA controlling signal RBA, an X-state pointer controlling signal XSPR applied internally, an Y-state pointer controlling signal YSPR, an X-state maximum bit X-MSB, and a Y-state maximum bit Y-MSE; row address generating means for generating a row address using an initial row address according to the control of the RBA controlling means; column address generating means for generating a column address using an initial column address according to the control of the RBA controlling means; a memory cell array for selecting its word line in accordance with the row address output from the row address generating means; RBA selecting means for controlling data transmission of the memory cell array in accordance with the signal output from the column address generating means and RBA controlling means; serial register means for transmitting data of the memory cell array according to the signal output from the RBA controlling means and RBA selecting means; RBA-Y decoder means for controlling the serial register means, using the column address output from the column address generating means according to the RBA controlling means; input/output controlling means for controlling the data-input/output according to the control of the RBA controlling means; input/output means for inputting/outputting data between the serial register means and outside according to the input/output controlling means; and half pel detecting means for outputting an X-state pointer controlling signal XSPR, an Y-state pointer controlling signal YSPR, an X-state maximum bit X-MSB, and a Y-state maximum bit Y-MSB in order to operate a half pel mode if the half pel read mode is determined to operate by detecting if it is an integer pel reading mode or half pel reading mode.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 9A is a diagram showing a memory map upon performing the RBA read operation in the integer pel mode of the present invention;

FIG. 9B is a diagram showing a memory map of performing the RBA read operation in the half pel mode of the present invention; and FIG. 9C is a diagram showing a memory map of performing the RBA write operation of the present invention.

DETAILED DESCRIPTION OF PREFERRED EMBODIMENT

Reference will now be made in detail to the preferred embodiments of the present invention, examples of which are illustrated in the accompanying drawings.

Figure 1:
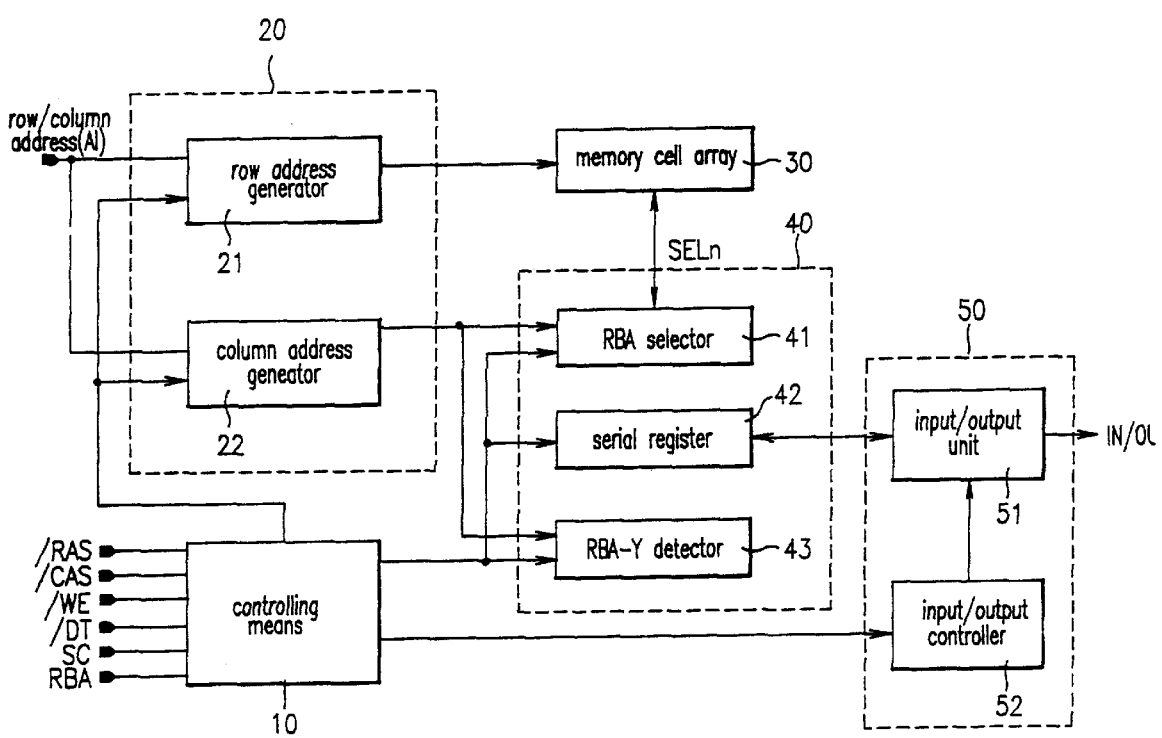
FIG. 1 is a block diagram of a conventional memory system for processing a digital video signal.
Figure 2:
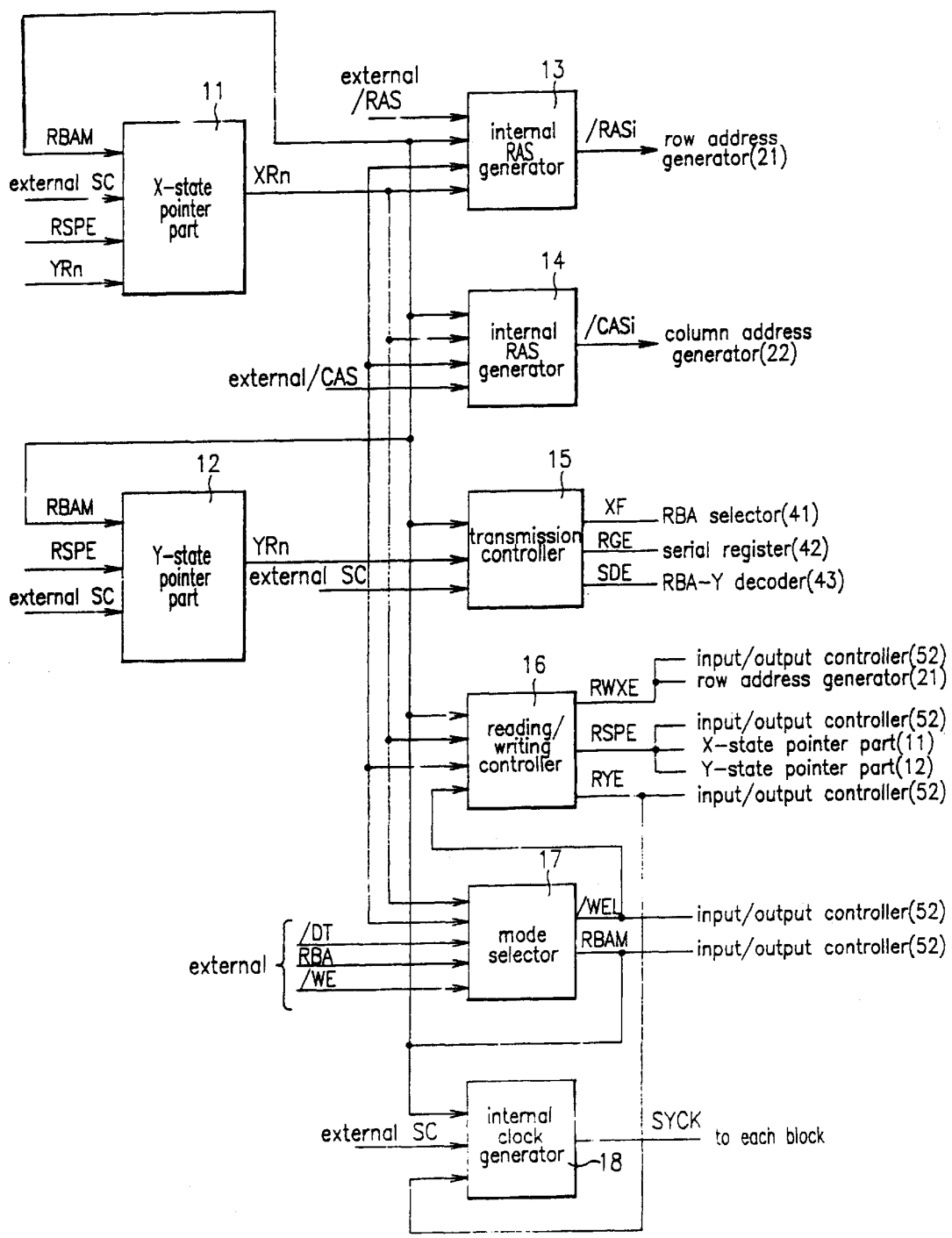
FIG. 2 is a detailed block diagram of an RBA controller of FIG. 1.
Figure 3:
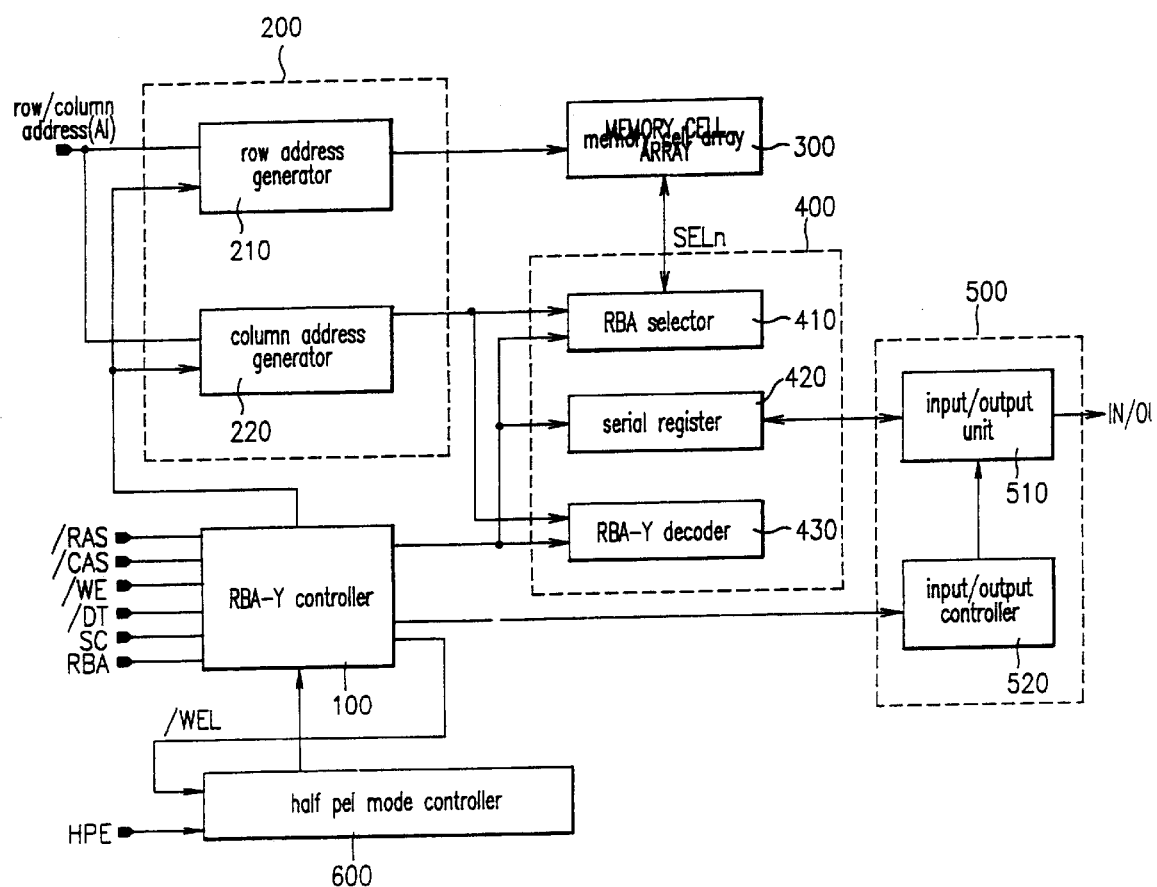
FIG. 3 is a block diagram of a memory system for processing a digital video signal of the present invention.

Referring to FIG. 3, a memory system for processing a digital video signal of the present invention includes a random block access RBA controller 100 for controlling the random block access using externally applied signals. An address generator 200 generates row and column addresses using an initial address AI under the control of the RBA controller 100. A memory cell array stores data under the control of the RBA controller 100 and the address generator 200. A transmission controller 400 controls the data transmission of the memory cell array 300 in accordance with the RBA controller 100 and the address generator 200. An input/output circuit 500 inputs and outputs data under the control of the RBA controller 100 and transmission controller 400. A half pel mode controller 600 controls the RBA controller 100 to access data in units of half pel mode block during the reading operation using an external half pel mode enable signal HPE and a write enable latch signal /WEL.

The address generator 200 includes a row address generator 210 and a column address generator 220. The transmission controller 400 is includes an RBA selector 410, a serial register 420, and an RBA-Y decoder 430. The input/output circuit 500 is made up with an input/output unit 510 and an input/output controller 520.

The RBA controller 100 outputs a signal which controls the row address generator 210, column address generator 220, RBA selector 410, serial register 420, RBA Y-decoder 430, and input/output controller 520. The RBA controller 100 utilizes an externally applied row address strobe signal /RAS, a column address strobe signal /CAS, a write enable signal /WE, a data transmission signal /DT, a serial clock /SC, an RBA controlling signal RBA, an internally applied X-state pointer reset signal XSPR, a Y-state pointer reset signal YSPR, an X-state MSB X-MSB, and a Y-state MSB Y-MSB.

The row address generator 210 of the address generator 200 selects word lines of the memory cell array 300 by generating a row address, using the initial row address of the block and signals output from the RBA controlling part 100. The column address generator 220 of the address generator 200 generates a column address, using the initial column address of the block and the signals output from the RBA controlling part 100, and then outputs the column address to the RBA selector 410 and RBA Y-decoder 430.

The memory cell array 300 is a DRAM cell array, controlled by the row address generator 210 and RBA selector 410 via word lines and bit lines.

The RBA selector 410 of the transmission controller 400 outputs a selecting signal SELn which controls the transmission of data between the memory cell array 300 and the serial register 420 according to signals output from the column address generator 220 and the RBA controller 100. The serial register 420 transmits/receives data to/from the memory cell array 300 and input/output unit 510 according to the signals output from the RBA selector 410, RBA-Y decoder 430 and RBA controller 100. The RBA-Y decoder 430 outputs a Y-address which controls the serial register 420, using the column address input from the column address generator 220 in accordance with the signals output from the RBA controller 100.

The input/output unit 510 of the input/output circuit 500 transmits/receives data to/from the serial register 420 under the control of the input/output controller 520, performing the data input/output with the outside. The input/output controller 520 controls the input/output unit according to the signals output from the RBA controller 100.

Figure 4:
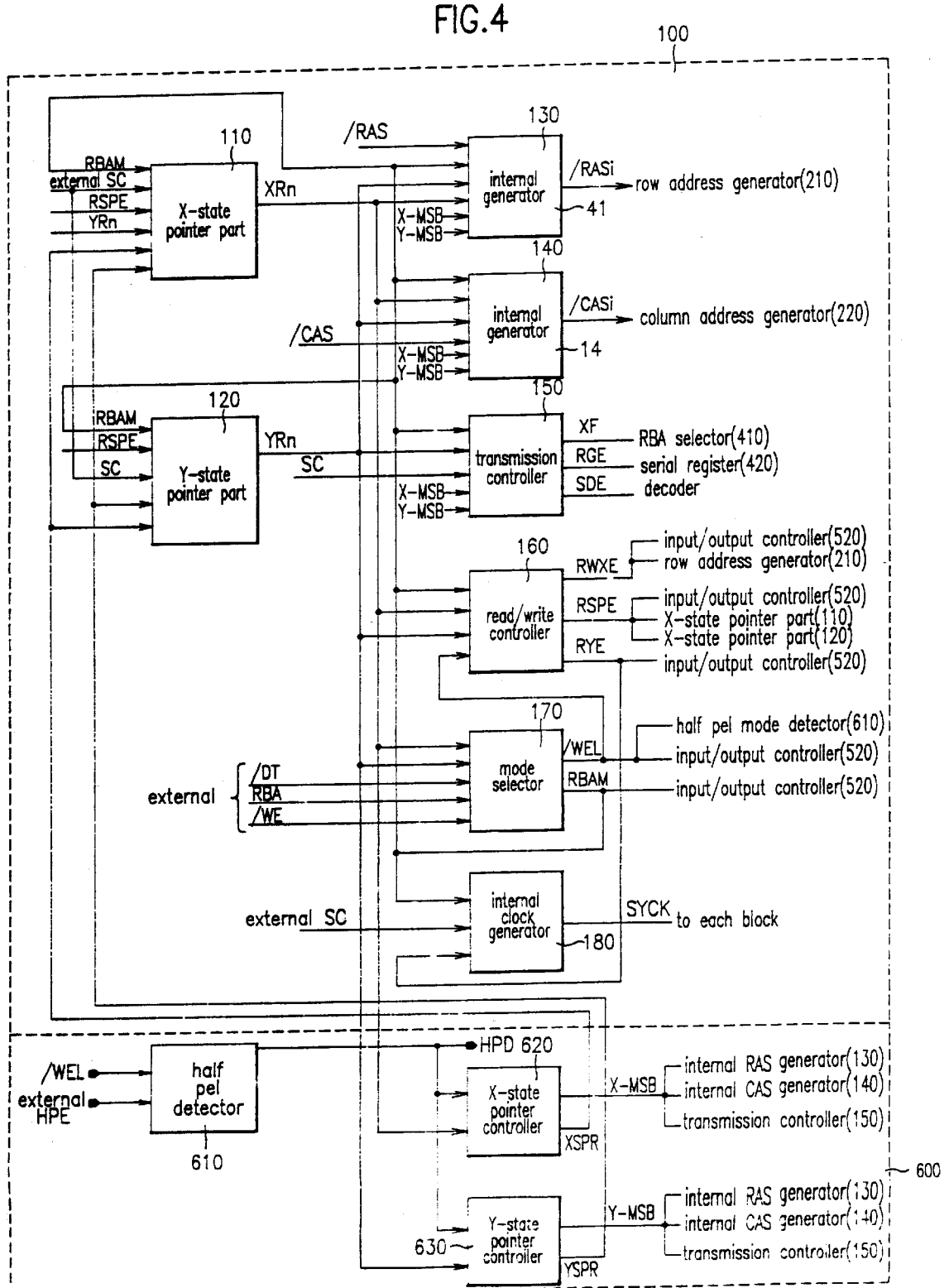
FIG. 4 is a detailed block diagram of the RBA controller and a half pel mode controller of FIG. 3.

As illustrated in FIG. 4, the RBA controller 100 includes an X-state pointer part 110, a Y-state pointer part 120, an internal RAS generator 130, an internal CAS generator 140, a transmission controller 150, a read/write controller 160, a mode selector 170, and an internal clock generator 180.

The half pel mode controller 600 includes a half pel detector 610, an X-state pointer controller 620, and a Y-state pointer controller 630.

The X-state pointer part 110, an n-bit counter, receives a serial clock SC, RBA mode flag signal RBAM, and RBA state pointer enable signal RSPE. The X-state pointer part 110 also receives a Y-state pointer signal YRn, X-state pointer reset signal XSPR, and Y-state pointer reset signal YSPR which are output from the Y-state pointer part 120, and outputs an X-state pointer signal XRn. When the RBA mode is set up, the n-bit counter 110 counts from "0", increments by "1" whenever the Y-state pointer signal YRn output from the Y-state pointer part 120 is reset to "0" in units of data block, and is reset by the X-state pointer reset signal XSPR.

The Y-state pointer part 120, another n-bit counter, receives the RBA mode flag signal RBAM, a RBA state pointer enable signal RSPE, serial clock SC, X-state pointer reset signal XSPR, and Y-state pointer reset signal YSPR, and then outputs a Y-state pointer signal YRn. Thus, When the RBA mode is set up, the counter 120 starts to count from "0" and increments by "1" for every cycle of serial clock. Therefore, during the counting operation, if the cycle of serial clock having the unit of data block is lapsed, the Y-state pointer part 120 is reset by the Y-state pointer reset signal YSPR and then re-starts to count from "0".

The internal RAS generator 130 outputs an internal RAS signal RASi to the row address generator 210, using an externally input row address strobe signal /RAS, X-state pointer signal XRn output from the X-state pointer part 110, Y-state pointer signal YRn output from the Y-state pointer part 120, RBA mode flag signal RBAM output from the mode selector 170, X-state MSB signal X-MSB output from the X-state pointer controller 620, and Y-state MSB signal Y-MSB output from the Y-state pointer controller 630. The generator 130 generates the internal RAS signal /RASi for accessing data from the memory cell array 300 for the first half of the serial clock cycle having the unit of data block, and then generates an internal RAS signal /RASi for refreshing for the second half of the serial clock cycle having the unit of data block.

The internal CAS generator 140 outputs a CAS signal /CASi to the column address generator 220 using externally applied column address strobe signal /CAS, X-state pointer signal XRn output from the X-state pointer part 110, Y-state pointer signal YRn output from the Y-state pointer part 120, RBA mode flag signal RBAM output from the mode selector 170, X-state MSB signal X-MSB output from the X-state pointer controller 620, and Y-state MSB signal Y-MSB output from the Y-state pointer controller 630. The internal CAS generator 140 generates an internal CAS signal /CASi for accessing data from the memory cell array 300 for the fist half of the serial clock cycle having the unit of data block, and then generates an internal CAS signal /CASi for refreshing for the second half of the serial clock cycle having the unit of data block.

The transmission controller 150 outputs a transmission signal XF to the RBA selector 410 for controlling data transmission from the memory cell array 300 to the serial register 420, outputs a register enable signal RGE to the serial register 420 for controlling power source Vcc to the serial register 420, and outputs a serial decoder enable signal SDE for enabling the RBA Y-decoder 430. The transmission controller 150 utilizes the Y-state pointer signal YRn output from the Y-state pointer part 120, the RBA mode flag signal RBAM output from the mode selector 170, the externally applied serial clock SC, X-state MSB signal X-MSB output from the X-state pointer controller 620, and Y-state MSB signal Y-MSB output from the Y-state pointer controller 630.

The read/write controller 160 receives the RBA mode flag signal RBAM output from the mode selector 170, a write enable latch signal /WEL, the X-state pointer signal XRn output from the X-state pointer part 110, and the Y-state pointer signal YRn output from the Y-state pointer part 120. The read/write controller 160 outputs an RBA write X enabling signal RWXE to the input/output controller 520, X-state pointer part 110 and Y-state pointer part 120 so that respective blocks can operate at a proper time point in the read mode or the write mode. The controller 160 also outputs an RBA state pointer enable signal RSPE to the X-state pointer part 110, the Y-state pointer part 120, and the input/output controller 520, and outputs the RBA Y-enable signal RYE to the input/output controller 520, the column address generator 220, and the internal clock generator 180.

The mode selector 170 receives the X-state pointer signal XRn output from the X-state pointer part 110, Y-state pointer signal YRn output from the Y-state pointer part 120, externally applied data transmission signal /DT, RBA control signal RBA, and write enable signal /WE. The mode selector 170 outputs an RBA mode flag signal RBAM setting up the RBA mode to respective blocks including the input/output controller 520. The selector 170 also outputs a write enable latch signal /WEL indicating the read mode or the write mode to the input/output controller 520, read/write controller 160, and column address generator 220.

The internal clock generator 180 generates system clocks SYCL from a time point at which Y-address signal should be enabled such that the system clocks are used as the clocks of signals related to Y-address. The internal generator 180 inputs the RBA mode flag signal RBAM output from the mode selector 170, RBA Y-enable signal RYE output from the read/write controller 160, and serial clock SC.

The half pel detector 610 detects if it is a half pel mode or an integer pel mode, using an external half pel mode enable signal HPE and the write enable latch signal /WEL output from the mode selector 170. The half pel detector 610 and then outputs a half pel detecting signal HPD if it is a half pel mode.

The X-state pointer controller 620 generates an X-state pointer reset signal XSPR, using the X-state pointer signal Xrn output from the X-state pointer part 110 and the half pel detecting signal HPD output from the half pel detector 610. The X-state pointer controller 620 outputs the signal XSPR to the X-state pointer part 110 and also outputs an X-state MSB signal X-MSB to the internal RAS generator 130, internal CAS generator 140, and the transmission controller 150.

The Y-state pointer controller 630 generates a Y-state pointer reset signal YSPR, using the Y-state pointer signal YRn output from the Y-state pointer part 120 and the half pel detecting signal HPD output from the half pel detector 610. The Y-state pointer controller 630 outputs the signal YSPR to the Y-state pointer part 120, and also outputs a Y-state MSB signal Y-MSB to the internal RAS generator 130, the internal CAS generator 140, and the transmission controller 150.

Hereinafter, the RBA reading operation of the memory system of the present invention will be described.

The RBA reading operation means a function in which the data of the memory cell array 300 is input in units of block of m×n bits, namely, 16×16 bits in case of an integer pel mode, and 17×17 bits in case of a half pel mode, while taking an address as the start address.

Figure 6:
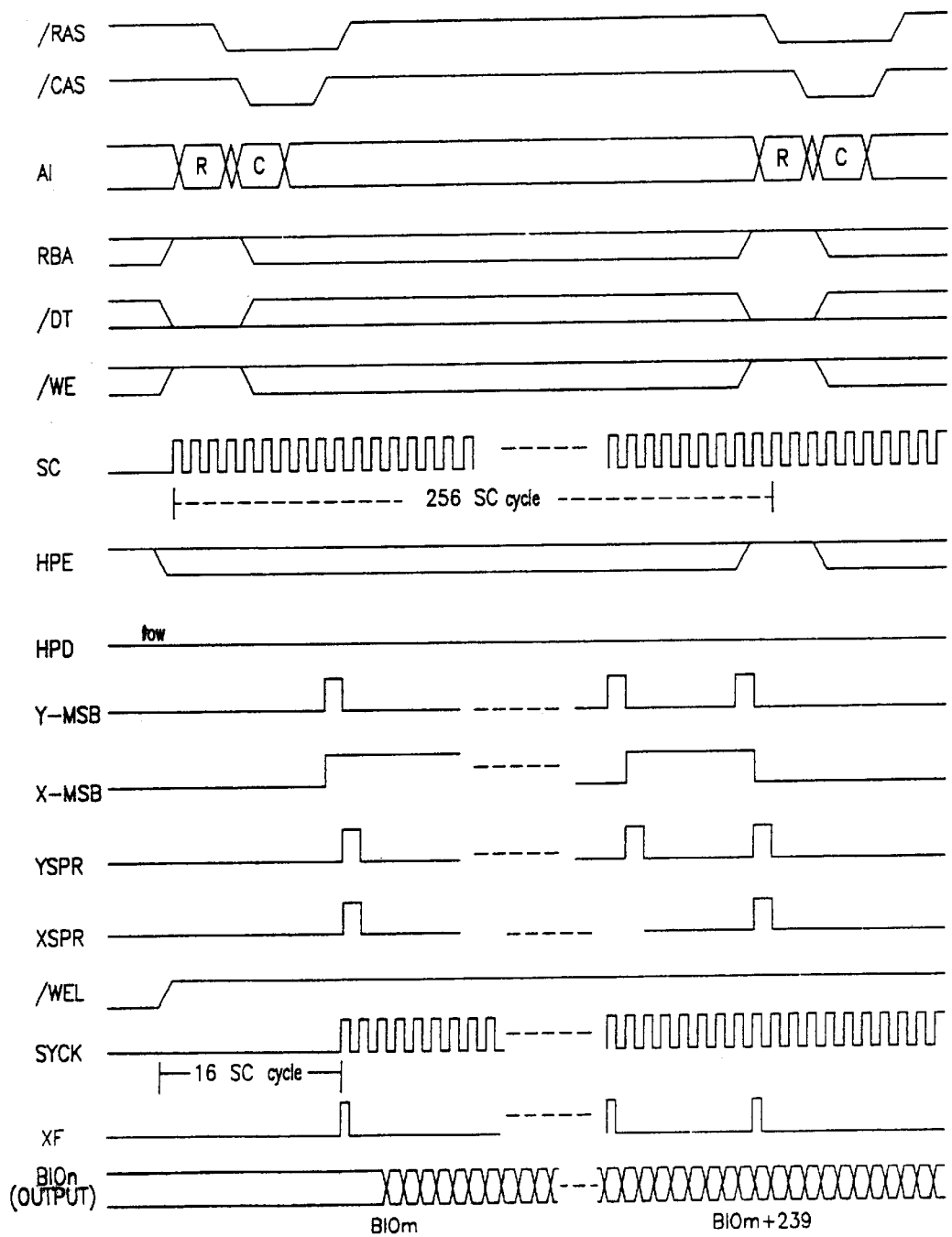
FIG. 6 is a diagram showing signal waveforms upon performing the RBA read operation in the integer pel mode of the invention.
Figure 7:
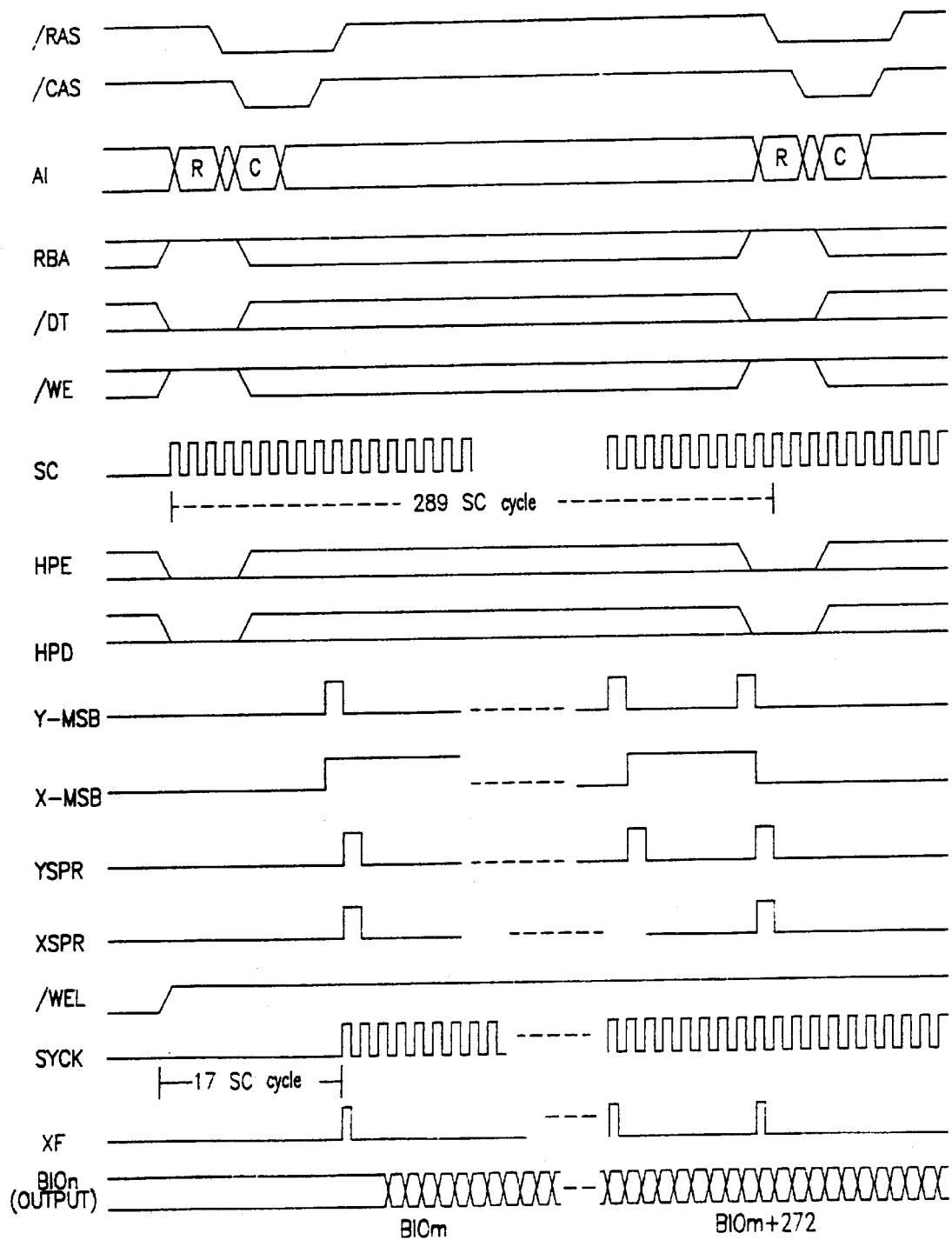
FIG. 7 is a diagram showing signal waveforms of performing the RBA read operation in the half pel mode of the invention.

When the RBA controlling signal RBA of a HIGH state, the data transmission signal /DT of a LOW state, and the write enable signal /WE of a HIGH state are applied to mode selector 170, at the falling edge where the row address strobe signal /RAS applied to the internal RAS generator 130 transitions from "HIGH" to "LOW" state as illustrated in FIGS. 6 and 7, the mode selector 170 renders both the RBA mode flag signal RBAM and the write enable latch signal /WEL HIGH state so that the system mode becomes the RBA read mode. Thus, the whole system starts the operation of RBA read mode. Here, it is determined whether the RBA read operation is the integer pel mode or the half pel mode by the half pel mode enable signal HPE and the write enable latch signal /WEL input to the half pel mode controller 610.

Hereinafter, the RBA read operation will be described, taking the integer pel mode and the half pel mode separately.

(1) Read Operation in the Integer Pel Mode

When the external half pel enable signal HPE is "LOW" as in FIG. 6, and the write enable latch signal /WEL output from the mode selector 170 is "HIGH", at the rising edge of the serial clock SC, the half pel detector 610 determines that the read operation is on integer pel mode, and then renders the half pel detecting signal HPD "LOW".

When the half pel detecting signal HPD output from the half pel detector 610 is "LOW", the X-state pointer controller 620 renders the X-state pointer reset signal XSPR "LOW" for every 16 cycles of serial clock, and the Y-state pointer controller 630 renders the Y-state pointer reset signal YSPR "LOW" for every 16 cycles of serial clock.

Here, because the X-state pointer part 110 of the RBA controller 100 is reset again when the X-state pointer reset signal XSPR becomes "LOW", and the Y-state pointer part 120 of the RBA controller 100 is reset again when the Y-state pointer reset signal YSPR becomes "LOW", the X-state pointer part 110 is reset every 16 cycles of serial clock, and the Y-state pointer part 120 is reset again every 16 cycles of serial clock.

The row address generator 210 generates an RBA row address, controlled by the X-state pointer part 110 and the serial clock SC, using the row address applied as an address input AI at the falling edge of the internal RAS signal RASi. Here, the generated internal row address, that is, X-address, is generated whenever the externally applied row address for every 16 cycles of serial clock is increased by "1" and it can continuously select 16 word lines of the memory cell array 300 when the 256th cycle of serial clock is lapsed.

The internal X-address capable of selecting the following 16 word lines is generated again, utilizing the externally input address input signal AI at the 257th cycle as an offset. This operation is repeated continuously.

The column address generator 220 generates an RBA column address for every cycle of serial clock by control signals output from the Y-state pointer part 120 and the internal clock generator 180, using Y-address, that is, the column address of address input signal AI externally applied at the falling edge of the internal CAS signal /CASi.

The internal Y-address, when operating the RBA read mode, is output after the X-address selects the word lines of the memory cell array 300 so that a bit line sense amplifier of the memory cell array then senses data in a memory cell, in other words, after 16 cycles of serial clock. This Y-address controls transfer of data from the selected memory cell to the serial register 420, using the selecting signal SELn output from the RBA selector 410, and also controls transfer of data of a desired block from the serial register 420 to data line, using the Y-address.

The Y-address value applied through the address input AI is latched onto an internal Y-address buffer, delayed in the RBA Y-address buffer (not shown) for 16 cycles of serial clock, and loaded on a Y-address counter (not shown), so that from this time, the Y-address is counted sequentially, incrementing by "1" for every cycle of serial clock, during the 16 cycles of serial clock. At the 17th cycle of serial clock, the same value as the above-initial value is re-loaded, thereby counting the same address as the address counted from the 1st cycle of serial clock to the 16th cycle of serial clock.

This operation is repeated sixteen times, that is, for 256 cycles of serial clock and the initial Y-address value of externally input address input signals AI is then re-loaded at the falling edge of the CAS signal /CAS for counting, and then pre-decoded to be output to the RBA selector 410 and RBA Y-decoder 430. The RBA selector 410 controls transfer of data from the memory cell selected by the X-address to the serial register 420, using the pre-decoded Y-address. The RBA Y-decoder 430 decodes the pre-decoded Y-address and then outputs the decoded Y-address to the serial register 420. Then, the serial register 420 transfers data to the input/output unit 510 using the decoded Y-address.

Meanwhile, the internal RAS generator 130 externally receives a row address strobe signal /RAS, the X-state pointer 20 signal XRn and Y-state pointer signal YRn from the X-state pointer part 110 and Y-state pointer part 120, the X-state MSB X-MSB and Y-state MSB Y-MSB from the X-state pointer controller 620 and Y-state pointer controller 630. The internal RAS generator 130 generates an internal RAS signal /RASi for accessing data of the memory cell array in the first half of the 16 cycles of serial clock, and also separates an internal RAS signal /RASi for refreshing in its second half.

The internal CAS generator 140 externally receives a column address strobe signal /CAS, the X-state pointer signal XRn and Y-state pointer signal YRn from the X-state pointer part 110 and Y-state pointer part 120, the X-state MSB X-MSB and Y-state MSB Y-MSB from the X-state pointer controller 620 and Y-state pointer controller 630. The internal CAS generator 140 generates an internal CAS signal /CASi for accessing data of the memory cell array in the first half of the 16 cycles of serial clock, and also generates an internal CAS signal /CASi for refreshing in the second half.

The internal RAS and CAS signals /RASi and /CASi generated from the internal RAS and CAS generators 130 and 140 are used as the row and column address strobe signals for the actual operation of the internal system, and controlled to perform the same operation for every 16 cycles of serial clock.

The transmission controller 150 generates a transmission signal XF for controlling a time point which is required to transfer data from the memory cell array 300 to the serial register 420, a register enable signal RGE, and a serial decoder enable signal SDE. Here, the transmission controlling unit 150 receives the X-state pointer signal XRn and Y-state pointer signal YRn respectively output from the X-state pointer part 110 and Y-state pointer part 120, and then generates one pulse, namely a transmission signal XF, once for every 16 cycles of serial clock after the row address strobe signal /RAS falls. Then, 16 cycles of serial clock lapse in order to transfer data of the memory cell selected by the X-address to the serial register 420.

The register enable signal RGE controls applying a power source Vcc to the serial register, and thereby facilitates data transmission. The serial decoder enable signal SDE enables the serial decoder forming the RBA Y-decoder 430, thereby controlling the data transmission between the serial register 420 and the input/output unit 510.

The X-state pointer part 110 and Y-state pointer part 120 start to count from (0,0), once the RBA mode is set up. The Y-state pointer part 120 increases by "1" for every cycle of serial clock, and is reset to count again from "0" after 16 cycles of serial clock. The X-state pointer part 110 increases by "1" whenever the Y-state pointer signal of the Y-state pointer part 120 is reset from "16" again to "0". Thereafter, if the X-state pointer signal XRn and the Y-state pointer signal YRn become the values of (16,16), the pointer parts start to count again from (0,0) in order to access the next block since the data access of one block has ended. That is, the present values of the X-state pointer signal XRn and the Y-state pointer signal YRn indicate the displacements to the initial X-address and the initial Y-address, namely, the values of address offset in the memory cell array 300.

Here, the X-state pointer part 110 and Y-state pointer part 120 are reset by the X-state pointer reset signal XSPR and Y-state pointer reset signal YSPR respectively output from the X-state pointer controller 620 and Y-state pointer controller 630 of the half pel mode controller 600. The X-state pointer part 110 and Y-state pointer part 120 in the integer pel mode become "LOW" for every 16 cycles of serial clock so that the two pointer parts 110 and 120 are not affected by the X-state pointer controller 620 and Y-state pointer controller 630.

In the read operation of the integer mode, the row address generator 210 generates the X-address at the falling edge of the row address strobe signal /RAS to select a word line, and the column address generator 220 generates the Y-address after 16 cycles of serial clock have lapsed from the falling edge of the row address strobe signal /RAS to enable the Y-address, so that data are transmitted from the memory cell array 300 to the serial register 420, and from the serial register 420 to the data line of the input/output unit 510. Therefore, for the RBA read mode, data OUTPUT is output to the input/output pad for block data of the input/output unit 510 at the falling edge of the row address strobe signal /RAS after 16 cycles of serial clock. Thereafter, data up to 239 cycles of serial clock can be continuously accessed in the RBA mode, and after the RBA mode is completed, the data are output after 16 cycles of serial clock.

(2) Read Operation in the Half Pel Mode

When the externally input half pel enable signal HPE is "HIGH" as shown in FIG. 7, and the write enable latch signal /WEL output from the mode selector 170 is "HIGH", the half pel detector 610 determines that the read operation is under the half pel mode, and then forms the half pel detecting signal HPD to "HIGH" state.

When the half pel detecting signal HPD output from the half pel detector 610 is "HIGH", the X-state pointer controller 620 forms the X-state pointer reset signal XSPR to "LOW" state for every 17 cycles of serial clock, and the Y-state pointer controller 630 forms the Y-state pointer reset signal YSPR to "LOW" state for every 17 cycles of serial clock. Here, the X-state pointer part 110 of the RBA controller 100 is reset again when the X-state pointer reset signal XSPR becomes "LOW" and the Y-state pointer part 120 of the RBA controller 100 is reset again when the Y-state pointer reset signal YSPR becomes "LOW". The X-state pointer part 110 is reset for every 16 cycles of serial clock, and reset again by the X-state pointer reset signal XSPR at the 17th cycle of the serial clock. The Y-state pointer part 120 is reset every 16 cycles of serial clock and reset again by the Y-state pointer reset signal YSPR at the 17th cycle of the serial clock.

That is, the X-state pointer part 110 and Y-state pointer part 120 start to count from (0,0), once the RBA mode is set up. The Y-state pointer part 120 increases by "1" every cycle of serial clock, and is reset to count again from "0" after 16 cycles of serial clock are lapsed. Here, as the Y-state pointer reset signal YSPR output from the Y-state pointer controller 630 becomes "LOW" at the 17th cycle of serial clock, the Y-state pointer part 120 is reset again at the 17th cycle of serial clock, and counts from "0".

Therefore, whenever the Y-state pointel signal YRn of the Y-state pointer part 120 is reset again to "0" by the Y-state pointer reset signal YSPR, after being reset from "16" to "0", the X-state pointer part 110 increases the pointer signal by "1". Similarly, the X-state pointer part 110 is reset to count again from "0" when the X-state pointer signal XRn becomes "16". Here, the pointer signal is reset by the X-state pointer reset signal XSPR output from the X-state pointer controller 620 and starts again to count from "0". Accordingly, if the X-state pointer signal XRn and the Y-state pointer signal YRn reach values of (17,17), the pointer parts start to count again from (0,0) in order to access the next block since the data access of one block has ended. That is, the present values of the X-state pointer signal XRn and the Y-state pointer signal YRn indicate the displacements to the initial X-address and the initial Y-address, namely, the values of address offset in the memory cell array 300.

Figure 5A:
FIGS. 5A and 5B are truth tables illustrating the operational state of the half pel mode controller of FIG. 3.
Figure 5B:

As shown in FIG. 5A, when the X-state pointer signal XRn output from the X-state pointer part 110 is "1", the X-state pointer controller 620 makes the X-state MSB X-MSB to "1" and outputs it to the internal RAS generator 130, internal CAS generator 140, and the transmission controller 150. As shown in FIG. 5B, when the Y-state pointer signal YRn output from the Y-state pointer part 120 is "1", the Y-state pointer controller 630 makes the Y-state MSB Y-MSB into "1" and outputs it to the internal RAS generator 130, the internal CAS generator 140, and the transmission controller 150.

Meanwhile, the internal RAS generator 130 externally receives a row address strobe signal /RAS, the X-state pointer signal XRn and Y-state pointer signal YRn respectively from the X-state pointer part 110 and Y-state pointer part 120, the X-state MSB X-MSB and Y-state MSB Y-MSB respectively from the X-state pointer controller 620 and Y-state pointer controller 630. The internal RAS generator 130 generates an internal RAS signal /RASi for accessing data of the memory cell array in the first half of the 17 cycles of serial clock, and also generates an internal RAS signal /RASi for refreshing in the second half.

The internal CAS generator 140 externally receives a column address strobe signal /CAS, the X-state pointer signal XRn and Y-state pointer signal YRn respectively from the X-state pointer part 110 and Y-state pointer part 120, the X-state MSB X-MSB and Y-state MSB Y-MSB respectively from the X-state pointer controller 620 and Y-state pointer controller 630. The internal CAS generates 140 generates an internal CAS signal /CASi for accessing data of the memory cell array in the first half of the 17 cycles of serial clock, and also generates an internal CAS signal /CASi for refreshing in the second half.

The internal RAS and CAS signals /RASi and /CASi generated from the internal RAS and CAS generators 130 and 140 are used as the row and column address strobe signals for the actual operation of the internal system, and controlled to perform the same operation for every 17 cycles of serial clock.

The transmission controller 150 generates a transmission signal XF for controlling a time point that is required to transfer data from the memory cell array 300 to the serial register 420, a register enable signal RGE, and a serial decoder enable signal SDE. Here, the transmission controller 150 receives the X-state pointer signal Xrn and Y-state pointer signal YRn output from the X-state pointer part 110 and Y-state pointer part 120, and then generates one pulse, namely the transmission signal XF, once for every 17 cycles of serial clock from after the row address strobe signal /RAS falls. Then, 17 cycles of serial clock are lapsed in order to transfer data of the memory cell selected by the X-address to the serial register 420.

The register enable signal RGE output from the transmission controller 150 controls applying power source Vcc to the serial register, and thereby facilitates the data transmission. The serial decoder enable signal SDE enables the serial decoder forming the RBA Y-decoder 430, thereby controlling the data transmission between the serial register 420 and the input/output unit 510.

The row address generator 210 generates an RBA row address, controlled by the X-state pointer part 110 and the serial clock SC, using the row address applied as an address input AI at the falling edge of the internal RAS signal RASi. Here, the generated internal row address, that is, X-address, is generated whenever the row address, externally applied for 17 cycles of serial clock, is increased by "1" and it can continuously select 17 word lines of the memory cell array 300 when the 289th cycle of serial clock is lapsed.

The internal X-address capable of selecting the following 17 word lines is generated again utilizing the address input signals AI externally input at the 290th cycle as an offset. This operation is repeated continuously.

The column address generator 220 generates an RBA column address every cycle of the serial clock through control signals output from the Y-state pointer part 120 and the internal clock generator 180, using Y-address, that is, the column address of address input signals AI externally applied at the falling edge of the internal CAS signal /CASi.

The internal Y-address, when operating under the RBA read mode, is output after the X-address selects word line of the memory cell array 300 so that a bit line sense amplifier in the memory cell array then senses data in a memory cell, that is, after 17 cycles of serial clock. This Y-address controls transfer of data from the selected memory cell to the serial register 420, using the selecting signal SELn output from the RBA selector 410, and controls transfer of data of a desired block from the serial register 420 to data line, using the Y-address.

The Y-address value applied through the address input AI is latched onto an internal Y-address buffer, delayed in the RBA Y-address buffer (not shown) for 17 cycles of serial clock, and loaded on a Y-address counter (not shown), so that from this time, the Y-address is counted sequentially, which is increased by "1" for every cycle of serial clock, during the 17 cycles of serial clock. At the 18th cycle of serial clock, the same value as the above-initial value is re-loaded, thereby counting the same address as the address counted from the 1st cycle of serial clock to the 17th cycle of serial clock.

This operation is repeated seventeen times, that is, for 289 cycles of serial clock and the initial Y-address value of externally input address input signals AI is then re-loaded at the falling edge of the CAS signal /CAS for counting, and then pre-decoded to be output to the RBA selector 410 and RBA Y-decoder 430. The RBA selector 410 controls to transfer data from the memory cell selected by the X-address to the serial register 420, using the pre-decoded Y-address. The RBA Y-decoder 430 decodes the pre-decoded Y-address and then outputs it to the serial register 420. Then, the serial register 420 transfers data to the input/output unit 510 using the decoded Y-address.

In the above-mentioned read operation under the half pel mode in more detail, the row address generator 210 generates the X-address at the falling edge of the row address strobe signal /RAS to select a word line, and the column address generator 220 generates the Y-address after 17 cycles of serial clock are lapsed from the falling edge of the row address strobe signal /RAS to enable the Y-address, so that data are transmitted from the memory cell array 300 to the serial register 420, and from the serial register 420 to the data line of the input/output unit 510.

Therefore, for the RBA read mode under the half pel mode, data OUTPUT is output to the input/output pad for block data of the input/output unit 510 at the falling edge of the row address strobe signal /RAS after 17 cycles of serial clock. Thereafter, data up to the 272 cycles of serial clock can be continuously accessed in the RBA mode, and after the RBA mode is completed, the data is output after 17 cycles of serial clock.

(3) RBA Write Operation

In an RBA write operation, regardless of whether it is the integer pel mode or the half pel mode, the RBA write is defined as a function of writing data input serially in a block size of m×n bits, for example, 16×16 bits. Therefore, the number of start address becomes two times 16 during the write operation.

Figure 8:
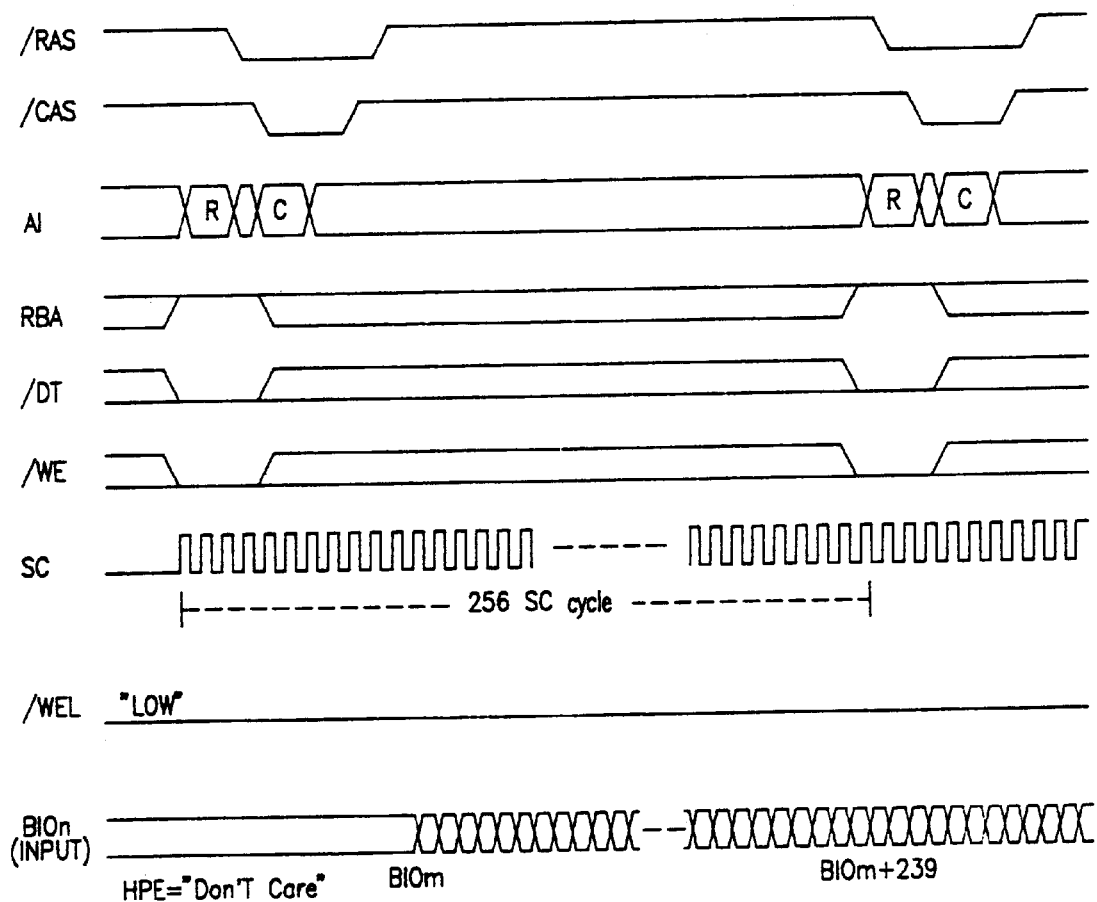
FIG. 8 is a diagram showing signal waveforms upon performing the RBA write operation of the present invention.

As illustrated in FIG. 8, if the internal column address strobe signal /CASi and RBA control signal RBA of "HIGH" levels, the data transmission signal /DT of "LOW" level, and the write enable signal /WE of "LOW" level, all generated at the falling edge of the internal RAS signal /RASi applied to the internal RAS generator 130, are applied to the mode selector 170, the mode selector 170 generates the RBA mode flag signal RBAM to "HIGH", and then generates the write enable latch signal /WEL to "LOW" for the RBA write mode. Through this operation, the whole system starts the operations of RBA write mode.

The basic operations of the respective blocks are identical to those of the operations of the RBA read mode.

The input data INPUT applied to the input/output pad of the input/output unit 510 appears and starts to be written to the serial register 420 after the row address strobe signal /RAS falls and 16 cycles of serial clock are then lapsed. It starts to transmit data from the serial register 420 to the memory cell array 300 after 32 cycles of serial clock are lapsed.

In order to control the above operation, the RBA Y enable signal RYE becomes "HIGH" after 16 cycles of serial clock, thereby causing signals related to the Y-address to be enabled such that data can be written into the serial register 420.

The RBA write X enable signal RWXE becomes "HIGH" after 32 cycles of serial clock, thereby causing signals related to the X-address to be enabled, such that data is thus transmitted from the serial register 420 to the memory cell array 300.

FIGS. 9A and 9B represent the memory maps of the operation of RBA read mode and the operation of RBA write mode, respectively.

As shown in FIG. 9A, upon performing the read mode properly to such an application program for accessing data in block size upon processing the digital signal, the block starting access is designated during the RBA read operation in the integer pel mode, so as to access data in block size of m×n bits, namely, 16×16 bits. The unit can be restored in the memory cell array in turn with the same block size. In the RBA read operation in the half pel mode, as shown in FIG. 9B, the block starting access is randomly designated so as to access data in turn by the block size of (m+1)×(n+1), namely 17×17 bits.

In the RBA write mode, as shown in FIG. 9C, the write function of serial blocks having the block size of m×n bits is provided, so that data processed by the signal processing unit can be restored in the memory cell array in turn with the same block size. Since the internal refresh counter is included in the memory system, the refresh function can be provided automatically without providing a refresh function externally upon performing the read/write mode.

Accordingly, in the memory system for processing digital video signal of the invention, data is accessed in a block size of m×n bits in the integer pel mode, or by a block size of (m+1)×(n+1) bits in the half pel mode. Data is written serially in a block size of m×n bits in the both integer pel mode or the half pel write mode. Thus, the memory system of the present invention can be used for MPEG and HDTV which operate in the half pel mode, thereby enhancing its resolution.

In addition, external control circuits are not required since the internal memory system of the present invention automatically processes the integer/half pel modes. Therefore, the system load for reformatting the external control circuit and read data can be reduced significantly, thereby decreasing data accessing/processing time, simplifying circuit structure, and reducing cost.

It will be apparent to those skilled in the art that various modifications and variations can be made in the memory system for processing digital video signal of the present invention without departing from the spirit or scope of the invention. Thus, it is intended that the present invention cover the modifications and variations of this invention provided they come within the scope of the appended claims and their equivalents.

What is claimed is:

1. A memory system for processing a digital video signal capable of accessing data in block units comprising:
   a detector circuit discriminating whether the memory system is in a reading/writing operation in an integer pel mode or a half pel mode; and
   a controller circuit coupled to the detector circuit and controlling access of data in units of m×n bit block when the memory system is determined to operate in the integer mode by the detector circuit, and controlling access of data in units of (m+1)×(n+1) bit block when the memory system is determined to operate in the half pel mode of a reading operation.

2. The system according to claim 1, wherein the controller circuit controls a random block accessing operation in units of 16×16 bit block when the detector circuit is determined to operate in the integer pel mode of a reading operation.

3. The system according to claim 1, wherein the controller circuit controls a random block accessing operation in units of 17×17 bit block when the detector circuit is determined to operate in the half pel mode of a reading operation.

4. The system according to claim 1, wherein the controller circuit controls a serial block write operation in units of 16×16 bit block when the detector circuit is determined to operate in the integer pel mode of a writing operation.

5. The system according to claim 1, wherein the controller circuit controls a serial block write operation in units of 16×16 bit block when the detector circuit is determined to operate in the half pel mode of a write operation.

6. A memory system for processing a digital video signal capable of accessing data in block units, comprising:
   a random block access (RBA) control unit controlling a random block access using externally applied signals;
   an address generation unit coupled to the RBA control unit and generating row and column addresses using an initial address under a control of the RBA control unit;
   a memory cell array coupled to the address generation unit and reading and writing data under a control of the RBA control unit and the address generation unit;
   a transmission control unit coupled to the memory cell array and including an RBA selector, a serial register, and an RBA-Y decoder, the transmission control unit controlling data transmission of the memory cell array in a serial manner under a control of the RBA control unit and the address generation unit;
   an input/output unit coupled to the transmission control unit and inputting and outputting data under a control of the RBA control unit and the transmission control unit; and
   a half pel mode control unit coupled to the RBA control unit and detecting whether the system is under an integer pel read mode or a half pel read mode, the half pel mode control unit controlling the RBA control unit to operate in the half pel read mode when the system is under the half pel read mode.

7. The system according to claim 6, wherein the RBA control unit comprises:
   a Y-state pointer part coupled to the half pel mode control unit and outputting a Y-state pointer signal for every cycle of serial clock when an RBA mode is set using an externally applied serial clock, an X-state pointer reset signal, and a Y-state pointer reset signal output from the half pel mode control unit;
   an X-state pointer part coupled to the half pel mode control unit and outputting an X-state pointer signal in accordance with the externally applied serial clock, the X-state pointer reset signal and the Y-state pointer reset signal output from the half pel mode control unit, and the Y-state pointer signal output from the Y-state point part;
   an internal RAS generator outputting an internal RAS signal in response to the X-state pointer signal and the Y-state pointer signal respectively output from the X-state pointer part and the Y-state pointer part, an X-state MSB and a Y-state MSB output from the half pel mode control unit, and an externally applied row address strobe signal;
   an internal CAS generator outputting an internal CAS signal in response to the X-state pointer signal and the Y-state pointer signal respectively output from the X-state pointer part and the Y-state pointer part, the X-state MSB and Y-state MSB output from the half pel mode control unit, and an externally applied column address strobe signal;
   a transmission controller outputting a transmission signal, a register enable signal, and a serial decoder enable signal respectively to the RBA selector, the serial register, and the RBA Y-decoder, utilizing the Y-state pointer signal output from the Y-state pointer part, externally applied serial clock, the X-state MSB signal and the Y-state MSB signal output from the half pel mode control unit, the transmission signal controlling data transmission between the memory cell array and the serial register, and date transmission between the serial register and the input/output unit.

8. The system according to claim 7, wherein the Y-state pointer part outputs the Y-state pointer signal that increases by a set number for every cycle of serial clock when the RBA mode is set, the Y-state pointer signal being reset when a serial clock cycle of data block sizes of half pel mode or integer pel mode is lapsed, and the Y-state pointer signal starting to count using the externally applied serial clock, the X-state pointer reset signal and the Y-state pointer reset signal output from the half pel mode control unit.

9. The system according to claim 7, wherein the X-state pointer part outputs the X-state pointer signal that increases by a set number whenever the Y-state pointer signal output from the Y-state pointer part is reset in block units of half pel mode or integer pel mode, using the externally applied serial clock, the X-state pointer reset signal and the Y-state pointer reset signal output from the half pel mode control unit.

10. The system according to claim 7, wherein the Y-state pointer part is reset again by the Y-state pointer reset signal output from the half pel mode control unit.

11. The system according to claim 7, wherein the X-state pointer part is reset again by the X-state pointer reset signal output from the half pel mode control unit.

12. The system according to claim 6, wherein the half pel mode control unit comprises:
a half pel detector detecting whether the system is under one of the half pel read mode and the integer pel read mode, using an external half pel enable signal and a write enable latch signal output from the RBA control unit, and the half pel detector outputting a half pel mode detecting signal when the system is under the half pel mode;
an X-state pointer controller coupled to the half pel detector and outputting the X-state pointer reset signal and the X-state MSB signal, using the X-state pointer signal output from the X-state pointer part, and the half pel detecting signal output from the half pel detector; and
a Y-state pointer controller coupled to the half pel detector and outputting the Y-state pointer reset signal and the Y-state MSB signal, using the Y-state pointer signal output from the Y-state pointer part, and the half pel detecting signal output from the half pel detector.

13. The system according to claim 12, wherein the X-state pointer controller triggers the X-state MSB signal to a first logic level when determined to be in the half pel read mode and the X-state pointer signals are all in the first logic level.

14. The system according to claim 12, wherein the Y-state pointer controller triggers the Y-state MSB signal to a first logic level when determined to be in the half pel read mode and the Y-state pointer signals are all in the first logic level.

15. A memory system for processing a digital video signal capable of accessing data in block units, comprising:
random block access (RBA) control unit controlling an access of data in m×n bit block units in an integer pel reading mode and (m+1)×(n+1) bit block units in a half pel reading mode, the RBA control unit utilizing an externally applied row address strobe signal, a column address strobe signal, a write enable signal, a data transmission signal, a serial clock, an RBA controlling signal, an internally applied X-state pointer reset signal, a Y-state pointer reset signal, an X-state MSB, and a Y-state MSB;
row address generating unit coupled to the RBA control unit and generating a row address using an initial row address under a control of the RBA control unit;
column address generating unit coupled to the RBA control unit and generating a column address using an initial column address under a control of the RBA control unit;
a memory cell array coupled to the row address generating unit and selecting word lines in accordance with the row address from the row address generating unit;
an RBA selecting unit coupled to the memory cell array and controlling data transmission of the memory cell array in accordance with signals output from the column address generating unit and the RBA control unit;
a serial register unit transmitting data of the memory cell array according to a signal output from the RBA control unit;
an RBA-Y decoder unit controlling the serial register unit, using the column address from the column address generating unit according to the RBA control unit;
input/output controlling unit controlling data input/output under a control of the RBA control unit;
input/output unit coupled to the serial register unit and inputting/outputting data under a control of the input/output controlling unit; and
a half pel mode controlling unit coupled to the RBA control unit and detecting whether the system is under an integer pel mode or a half pel read mode, and the half pel mode controlling unit outputting an X-state pointer controlling signal, a Y-state pointer controlling signal, an X-state MSB, and a Y-state MSB when the system is under the half pel read mode.

16. The system according to claim 15, wherein the RBA control unit comprises:
a Y-state pointer part coupled to the half pel mode control unit and outputting a Y-state pointer signal for every cycle of serial clock when an RBA mode is set using an externally applied serial clock, an X-state pointer reset signal, and a Y-state pointer reset signal output from the half pel mode control unit;
an X-state pointer part coupled to the half pel mode control unit and outputting an X-state pointer signal in accordance with the externally applied serial clock, the X-state pointer reset signal and the Y-state pointer reset signal output from the half pel mode control unit, and the Y-state pointer signal output from the Y-state point part;
an internal RAS generator outputting an internal RAS signal in response to the X-state pointer signal and the Y-state pointer signal respectively output from the X-state pointer part and the Y-state pointer part, the X-state MSB and a Y-state MSB output from the half pel mode control unit, and an externally applied row address strobe signal;
an internal CAS generator outputting an internal CAS signal in response to the X-state pointer signal and the Y-state pointer signal respectively output from the X-state pointer part and the Y-state pointer part, the X-state MSB and Y-state MSB output from the half pel mode control unit, and an externally applied column address strobe signal;
a transmission controller outputting a transmission signal, a register enable signal, and a serial decoder enable signal respectively to the RBA selector, the serial register, and the RBA Y-decoder, utilizing the Y-state pointer signal output from the Y-state pointer part, externally applied serial clock, the X-state MSB signal and the Y-state MSB signal output from the half pel mode control unit, the transmission signal controlling data transmission between the memory cell array and the serial register, and date transmission between the serial register and the input/output unit.

17. The system according to claim 16, wherein the Y-state pointer part outputs the Y-state pointer signal that increases by a set number for every cycle of serial clock when the RBA mode is set, the Y-state pointer signal being reset when a serial clock cycle of data block sizes of half pel mode or integer pel mode is lapsed, and the Y-state pointer signal starting to count using the externally applied serial clock, the X-state pointer reset signal and the Y-state pointer reset signal output from the half pel mode control unit.

18. The system according to claim 16, wherein the X-state pointer part outputs the X-state pointer signal that increases by a set number whenever the Y-state pointer signal output from the Y-state pointer part is reset in block units of half pel mode or integer pel mode, using the externally applied serial clock, the X-state pointer reset signal and the Y-state pointer reset signal output from the half pel mode control unit.

19. The system according to claim 16, wherein the Y-state pointer part is reset again by the Y-state pointer reset signal output from the half pel mode control unit.

20. The system according to claim 16, wherein the X-state pointer part is reset again by the X-state pointer reset signal output from the half pel mode control unit.

21. The system according to claim 15, wherein the half pel mode control unit comprises:

a half pel detector detecting whether the system is under one of the half pel read mode and the integer pel read mode, using an external half pel enable signal and a write enable latch signal output from the RBA control unit, and the half pel detector outputting a half pel mode detecting signal when the system is under the half pel mode;

an X-state pointer controller coupled to the half pel detector and outputting the X-state pointer reset signal and the X-state MSB signal, using the X-state pointer signal output from the X-state pointer part, and the half pel detecting signal output from the half pel detector; and a Y-state pointer controller coupled to the half pel detector and outputting the Y-state pointer reset signal and the Y-state MSB signal, using the Y-state pointer signal output from the Y-state pointer part, and the half pel detecting signal output from the half pel detector.

22. The system according to claim 21, wherein the X-state pointer controller triggers the X-state MSB signal to a first logic level when determined to be in the half pel read mode and the X-state pointer signals are all in the first logic level.

23. The system according to claim 21, wherein the Y-state pointer controller triggers the Y-state MSB signal to a first logic level when determined to be in the half pel read mode and the Y-state pointer signals are all in the first logic level.

24. A method of accessing data in block units, the method comprising the steps of:

receiving a control signal from a source containing information on a mode of operation;

determining whether the mode of operation is an integer pel mode or a half pel mode;

accessing the data in m×n bit block units when the operation is determined to be the integer pel mode; and accessing the data in (m+1)×(n+1) bit block units when the operation is determined to be the half pel mode.

25. The method according to claim 24, wherein the step of accessing the data in m×n bit block units includes the step of accessing the data in 16×16 bit block units for the integer pel mode during a read operation.

26. The method according to claim 24, wherein the step of accessing the data in (m+1)×(n+1) bit block units includes the step of accessing data in 17×17 bit block units for the half pel mode during a read operation.

27. The method according to claim 24, further comprising the step of writing data in m×n bit block units for integer pel and half pel modes.

* * * * *